(12) United States Patent
Yamada

(10) Patent No.: US 7,196,523 B1
(45) Date of Patent: Mar. 27, 2007

(54) BATTERY CHARGE/DISCHARGE MONITORING CIRCUIT AND METHOD

(75) Inventor: Susumu Yamada, Gunma (JP)

(73) Assignee: Sanyo Electric Co., Ltd, Osaka (JP)

( * ) Notice: Subject to any disclaimer, the term of this patent is extended or adjusted under 35 U.S.C. 154(b) by 292 days.

(21) Appl. No.: 10/831,631

(22) Filed: Apr. 23, 2004

(30) Foreign Application Priority Data

Apr. 25, 2003 (JP) ............................. 2003-121754
Sep. 29, 2003 (JP) ............................. 2003-338864

(51) Int. Cl.
*G01N 27/416* (2006.01)
(52) U.S. Cl. .................................................. 324/428
(58) Field of Classification Search ............... 324/428; 320/128, 132
See application file for complete search history.

(56) References Cited

U.S. PATENT DOCUMENTS

| | | | |
|---|---|---|---|
| 4,246,529 A | 1/1981 | Helal | 320/139 |
| 4,679,000 A | 7/1987 | Clark | 324/428 |
| 4,803,416 A * | 2/1989 | Abiven et al. | 320/132 |
| 5,841,284 A | 11/1998 | Takahashi | 324/428 |
| 6,054,861 A | 4/2000 | Takahashi | 324/428 |
| 6,157,170 A * | 12/2000 | Noda et al. | 320/132 |
| 6,285,164 B1 | 9/2001 | Noda et al. | 320/132 |
| 6,693,577 B2 * | 2/2004 | Yamamoto | 341/155 |
| 2003/0016154 A1 | 1/2003 | Yamamoto | 341/155 |

FOREIGN PATENT DOCUMENTS

| | | |
|---|---|---|
| EP | 0952456 | 10/1999 |
| JP | 6-136628 | 5/1996 |
| JP | 2001185232 | * 7/2001 |
| JP | 2001305166 | * 10/2001 |

OTHER PUBLICATIONS

European Patent Office Search Report, Jul. 26, 2004, App 04252395.1-2207, Ref PJC/G23987EP, 53 pages.
European Patent Office Search Report, Jul. 18, 2005, App 04252395.1-2207, Ref PJC/G23987EP, 7 pages.

* cited by examiner

*Primary Examiner*—Pia Tibbits
(74) *Attorney, Agent, or Firm*—SoCal IP Law Group LLP; Steven C. Sereboff

(57) ABSTRACT

A circuit for monitoring charge/discharge of a battery is disclosed. The circuit may comprise first and second terminal capacitors disposed for first and second terminals of a current detection resistor connected to a battery. The first and second terminal capacitors may develop an integrated voltage responsive to the charge/discharge current obtained from the individual terminals. The circuit may also include at least one comparator for comparing the individual integrated voltages developed by the first and second terminal capacitors with a reference voltage, the comparator having respective outputs which change when the individual integrated voltages reach the reference voltage. A terminal-by-terminal output change count difference output unit may count the number of times the output of the comparator changes and may output the difference between the number of times of change corresponding to the first terminal and the number of times of change corresponding to the second terminal.

13 Claims, 5 Drawing Sheets

BATTERY CHARGE/DISCHARGE MONITORING CIRCUIT AND METHOD

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

This application claims the benefit of priority to Japanese Patent Application Nos. 2003-121754 filed on Apr. 25, 2003 and 2003-338864 filed on Sep. 29, 2003, of which contents are incorporated herein by reference.

BACKGROUND OF THE INVENTION

1. Field of the Invention

The present invention relates to a circuit for and a method of monitoring charge/discharge of a battery.

2. Description of the Related Art

In the battery charge/discharge monitoring circuit disclosed, for example, in Japanese Patent Application Laid-Open Publication No. 1996-136628, two circuit systems are provided for a battery, one for monitoring its charge and the other for monitoring its discharge as shown in FIG. 7 of the publication.

The discharge monitoring circuit system activated during battery discharge has a discharge current detection resistor Rs1 provided at one of the battery terminals, detecting the potential difference between the two terminals of the resistor Rs1 with a discharge capacity detection unit. The discharge capacity detection unit outputs pulses proportional to a discharge current flowing through the discharge current detection resistor Rs1 to a discharge monitoring counter. The discharge monitoring counter counts the number of times the pulses are input from the discharge capacity detection unit, outputting the result to a judgment unit. The judgment unit judges the battery's remaining capacity based on the number of times the pulses have been input.

On the other hand, the charge monitoring circuit system activated during battery charge has a charge current detection resistor Rs2 provided at the other battery terminal, detecting the potential difference between the two terminals of the resistor Rs2 with a charge capacity detection unit. The charge capacity detection unit outputs pulses proportional to a charge current flowing through the charge current detection resistor Rs2 to a charge monitoring counter. The charge monitoring counter counts the number of times the pulses are input from the charge capacity detection unit, outputting the result to a judgment unit. The judgment unit judges the battery's charge capacity based on the number of times the pulses have been input.

The conventional circuit disclosed in the Japanese Patent Application Laid-Open Publication No. 1996-136628 is provided with two circuit systems, one for monitoring discharge and the other for monitoring charge, thus resulting in a larger circuit in scale, which is not preferred in terms, for example, of downsizing and manufacturing cost.

For measuring the battery capacity change with extreme precision, it is necessary to detect an extremely small voltage change on the order of several millivolts. However, since charge monitoring and discharge monitoring are basically implemented respectively by different circuit systems, the ground level varies differently in one system from the other. This difference in ground level leads to an innegligible error in detecting an extremely small voltage change for precise judgment of the battery capacity when charge monitoring and discharge monitoring are conducted alternately. Besides, if error signal component such as common noise accumulates in both circuit systems, it becomes impossible to precisely determine the battery capacity.

SUMMARY OF THE INVENTION

One aspect of the present invention provides a circuit for monitoring charge/discharge of a battery, comprising first and second terminal capacitors disposed respectively for first and second terminals of a current detection resistor connected to a battery for detecting a charge or discharge current of the battery, the first and second terminal capacitors developing an integrated voltage responsive to the charge/discharge current obtained from the individual terminals; at least one comparator for comparing the individual integrated voltages developed by the first and second terminal capacitors with a reference voltage, the at least one comparator having respective outputs which change when the individual integrated voltages reach the reference voltage; and a terminal-by-terminal output change count difference output unit for counting the number of times of change in the output of the at least one comparator associated respectively with the first and second terminal capacitors, the terminal-by-terminal output change count difference output unit outputting the difference between the number of times of change corresponding to the first terminal and the number of times of change corresponding to the second terminal.

As used herein, the term "integrated voltage" refers to a voltage as an integrated value responsive to the charge accumulated in accordance with the current.

According to this battery charge/discharge monitoring circuit, the numbers of times the outputs of the at least one comparator for the first and second terminal capacitors change are counted, and the difference between the numbers of times change takes place is output for the first and second terminals. Therefore, it is possible to eliminate error signal component such as ground level variation and common noise in the battery charge/discharge monitoring circuit by taking the difference in number of times the outputs of the at least one comparator change between the two terminals.

This allows implementing charge and discharge monitoring with a single circuit system. Even in the case of an extremely small potential change detected from the individual terminals of the current detection resistor—the resistor provided for detecting the battery charge or discharge current, it is possible to precisely monitor the amount of charge or discharge current, thus allowing for accurate measurement of the battery capacity or residual capacity.

The circuit for monitoring charge/discharge of a battery may comprise the current detection resistor; and a voltage/current converter for converting the terminal voltages appearing at the first and second terminals of the current detection resistor to a current and supplying the current to the terminal capacitors.

According to this battery charge/discharge monitoring circuit, the terminal voltage appearing at each of the terminals of the current detection resistor is detected rather than the voltage between the resistor terminals. The individual terminal voltages are used as the source of integrated voltages developed by the individual terminal capacitors.

The voltage/current converter may be disposed for each of the first and second terminals, and each of the voltage/current converters may convert the terminal voltage appearing at the corresponding terminal to a current and supplies the current to the corresponding terminal capacitor.

According to this battery charge/discharge monitoring circuit, it is possible to simultaneously convert the individual terminal voltages to currents, thus speeding up monitoring of the amount of battery current.

The terminal-by-terminal output change count difference output unit may include a first terminal counter disposed for the first terminal and counting the number of times of change in the output of the comparator associated with the first terminal capacitor; a second terminal counter disposed for the second terminal and counting the number of times of change in the output of the comparator associated with the second terminal capacitor; and a subtracter for outputting the difference between the number of changes output from the first terminal counter and the number of changes output from the second terminal counter.

The circuit for monitoring charge/discharge of a battery may further comprise switching units for selecting terminal voltages appearing at the first and second terminals connected to the current detection resistor, and the voltage/current converter may be shared between the first and second terminals. The voltage/current converter may convert the terminal voltage appearing at either the first or second terminal selected by the switching unit, to a current and supplies the current to the corresponding first or second terminal capacitor.

According to this battery charge/discharge monitoring circuit, it is possible to resolve the impact of variations in mutual circuit elements as compared with the case in which a voltage/current converter is provided for each of the terminals. Therefore, it is possible to provide improved precision in the output of a terminal-by-terminal output change count difference output unit. This also allows for component count reduction, thus downsizing the circuit scale, which in turn ensures noise reduction, power and space savings and cost reduction.

The comparator may be shared between the first and second terminals, and the comparator may compare the integrated voltage, developed by the terminal capacitor corresponding to either the first or second terminal selected by the switching unit, with the reference voltage. In this case, when the integrated voltage reaches the reference voltage, the output of the comparator may change.

According to this battery charge/discharge monitoring circuit, it is possible to resolve the impact of variations in mutual circuit elements as compared with the case in which a comparator is provided for each terminal. Therefore, it is possible to provide improved precision in the output of the terminal-by-terminal output change count difference output unit. This also allows for component count reduction, thus downsizing the circuit scale, which in turn ensures noise reduction, power and space savings and cost reduction.

The terminal-by-terminal output change count difference output unit may include a difference output counter shared between the first and second terminals, and the difference output counter may count the number of times of change for the first or second terminal capacitor selected by the switching unit, the difference output counter outputting the difference between the numbers of changes for the first and second capacitors.

According to this battery charge/discharge monitoring circuit, it is possible to resolve the impact of variations in mutual circuit elements as compared with the case in which a counter is provided for each terminal. Therefore, it is possible to provide improved precision in the output of the terminal-by-terminal output change count difference output unit. This also allows for component count reduction, thus downsizing the circuit scale, which in turn ensures noise reduction, power and space savings and cost reduction.

Alternatively, the current detection resistor may be connected in series with the battery.

According to this battery charge/discharge monitoring circuit, the current detection resistor is shared between the first and second terminals rather than being provided for each of the first and second terminals. This facilitates the circuit configuration and ensures power and space savings and cost reduction.

Further, the battery charge/discharge monitoring circuit may be integrated into an IC.

Another aspect of the present invention provides a method of monitoring charge/discharge of a battery, comprising the steps of developing integrated voltages responsive to charge/discharge currents obtained from first and second terminals of a current detection resistor connected to the battery for detecting a charge or discharge current of the battery; comparing the individual integrated voltages with a reference voltage, wherein when the individual integrated voltages reach the reference voltage, the result of comparison changes; and counting the number of times of change in the result of comparison and outputting the difference between the number of times of change corresponding to the first terminal and the number of times of change corresponding to the second terminal In such a battery charge/discharge monitoring circuit, the first terminal capacitor is comprised of a plurality of capacitors such that when the integrated voltage developed by one of the capacitors reaches the reference voltage, the other capacitor being discharged begins to develop the integrated voltage, whereas the second terminal capacitor is comprised of a plurality of capacitors such that when the integrated voltage developed by one of the capacitors reaches the reference voltage, the other capacitor being discharged begins to develop the integrated voltage. Alternatively, the integrated voltage of one of the capacitors after reaching the reference voltage may be discharged when the other capacitor is developing the integrated voltage in the first and second terminal capacitors. Further alternatively, the first and second terminal capacitors may each being comprised of two capacitors. This reduces the dead time in capacitor discharge when the comparator compares the integrated voltage and the reference voltage, thus providing improved accuracy in battery capacity or residual capacity measurement.

Alternatively, the first and second terminal capacitors in the battery charge/discharge monitoring circuit may be selectively assigned to two of three or more capacitors. This allows downsizing the battery charge/discharge monitoring circuit when three capacitors are made available. It is possible, if the battery charge/discharge monitoring circuit is integrated into an IC in particular, to downsize the charger and others incorporating the IC. Further, two capacitors are not fixed as the first and second terminal capacitors, thus reducing capacitors' capacitance error as a result of averaging and providing improved accuracy in battery capacity or residual capacity measurement.

Discharge and charge monitoring can be implemented with a single circuit system. Even in the case of an extremely small potential change detected from individual terminals of the current detection resistor—the resistor provided for detecting battery charge or discharge current, it is possible to precisely monitor the amount of charge or discharge current, thus allowing for accurate measurement of the battery capacity or residual capacity.

DESCRIPTION OF THE DRAWINGS

The above and other aspects, features and advantages of the present invention will become more apparent from the following detailed description when taken in conjunction with the accompanying drawings, in which.

DETAILED DESCRIPTION OF THE INVENTION

First Embodiment

Figure 1:
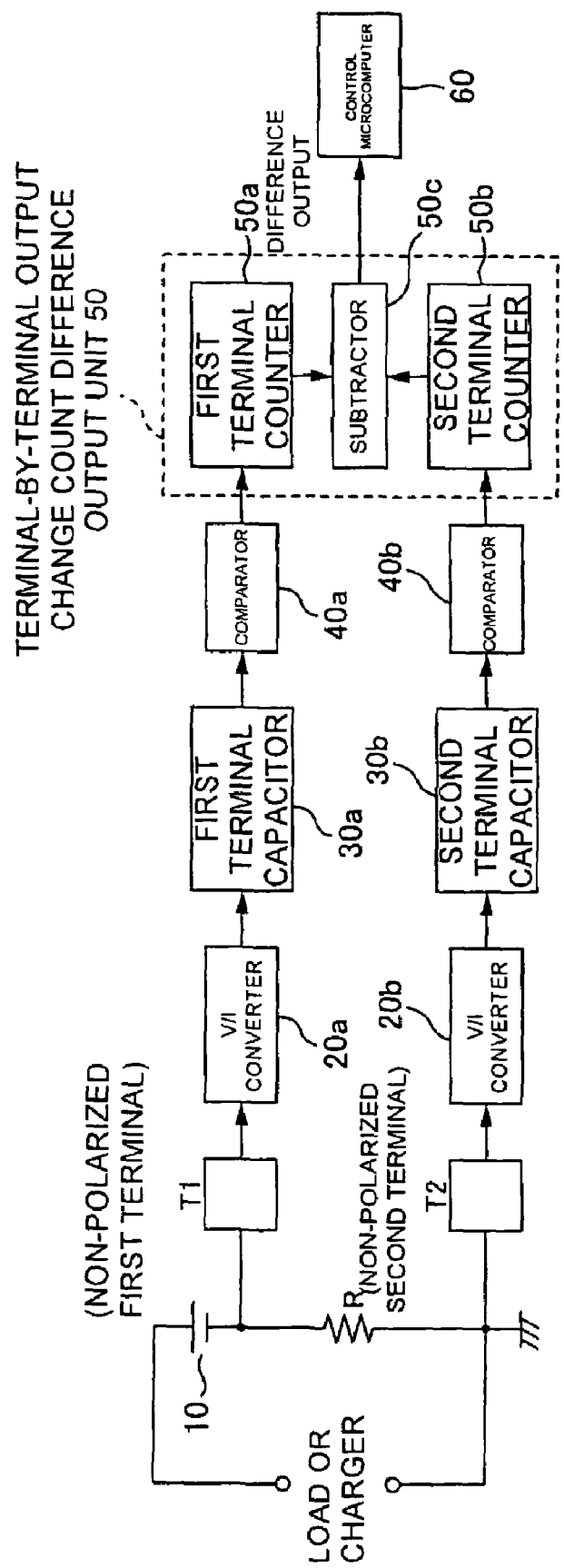
FIG. 1 is a block diagram showing a battery charge/discharge monitoring circuit according to a first embodiment of the present invention.

As an example, a current detection resistor R for detecting the charge or discharge current of a battery 10 is connected in series with the battery 10 as shown in FIG. 1. A load supplied with power by the battery 10 or a charger for charging the battery 10 is connected to the series circuit including the battery 10 and the current detection resistor R. A first terminal T1 is connected to one of the terminals (first terminal) of the current detection resistor R, whereas a second terminal T2 is connected to the other terminal (second terminal). The first and second terminals T1 and T2 are non-polarized, which means they are battery polarity insensitive. Also, either of the terminals (e.g., the second terminal T2) is grounded. Potential detection systems for the first and second terminals T1 and T2, namely, the terminals of the current detection resistor R, are separate from each other.

That is, there are provided terminal-specific charge/discharge monitoring systems equipped with a series of voltage/current converters 20a and 20b, first and second terminal capacitors 30a and 30b and comparators 40a and 40b respectively for the first and second terminals T1 and T2. The outputs (results of comparison) of the comparators 40a and 40b are fed to a terminal-by-terminal output change count difference output unit 50. The terminal-by-terminal output change count difference output unit 50 counts the number of times the output of each of the comparators 40a and 40b changes. The terminal-by-terminal output change count difference output unit 50 outputs the difference in the number of times changes have occurred between the first and second terminals T1 and T2 to a microcomputer 60.

Such a configuration allows for both terminal-specific charge/discharge monitoring systems, a subtracter 50c and the microcomputer 60 to operate as a single battery charge/discharge monitoring circuit, irrespective of whether the battery is charged or discharged.

First of all, in describing the operation of the first terminal-specific charge/discharge monitoring system, the voltage/current converter 20a converts the terminal voltage appearing at the first terminal T1 connected to the current detection resistor R to a current, supplying the current to the first terminal capacitor 30a. This results in the integrated voltage proportional to the charge or discharge current obtained from one end (e.g., positive terminal) of the battery 10 (voltage as an integrated value responsive to the charge accumulated in accordance with the current) being developed in the first terminal capacitor 30a.

The comparator 40a compares the integrated voltage developed by the first terminal capacitor 30a with the reference voltage. When the integrated voltage reaches the reference voltage, the comparator 40a varies its output. Then, the output of the comparator 40a varies again as a result of discharge of the first terminal capacitor 30a. Therefore, a first terminal counter 50a counts the number of times the comparator 40a's output changes.

Next, in describing the operation of the second terminal-specific charge/discharge monitoring system, the voltage/current converter 20b converts the terminal voltage appearing at the second terminal T2 connected to the current detection resistor R to a current, supplying the current to the second terminal capacitor 30b. This results in the integrated voltage proportional to the charge or discharge current obtained from one end (e.g., negative terminal) of the battery 10 being developed in the second terminal capacitor 30b.

The comparator 40b compares the integrated voltage developed by the second terminal capacitor 30b with the reference voltage. When the integrated voltage reaches the reference voltage, the comparator 40b varies its output. Then, the output of the comparator 40b varies again as a result of discharge of the second terminal capacitor 30b. Therefore, a second terminal counter 50b counts the number of times the comparator 40b's output changes.

The subtracter 50c outputs the difference between the number of changes output by the first terminal counter 50a and that output by the second terminal counter 50b.

For instance, if the first terminal T1 is connected to the positive terminal of the battery during discharge, the number of times changes take place counted by the first terminal counter 50a not only reflects the battery's charge or discharge current but also includes error signal component such as ground level variation and common noise. On the other hand, the second terminal T2 is connected to the negative terminal of the battery during discharge. The number of times changes take place counted by the second terminal counter 50b reflects error signal component alone such as ground level variation and common noise.

Therefore, the difference output of the subtracter 50c has error signal component canceled out such as ground level variation and common noise, thus becoming a signal reflecting the battery's charge or discharge current alone. The difference output is supplied to the control microcomputer 60. The control microcomputer 60 determines the battery's charge or discharge current based on the obtained difference output and calculates the battery's residual capacity or charge capacity. The control microcomputer 60 notifies users and others of the battery's charge or discharge status or capacity through a display device, etc. based on the calculation result.

It is to be noted that, as an example of implementation of the battery charge/discharge monitoring circuit, at least the voltage/current converters 20a and 20b, the first and second terminal capacitors 30a and 30b, the comparators 40a and 40b and the terminal-by-terminal output change count difference output unit 50 are made into a chip (IC), with the first and second terminals T1 and T2 made available in the form of external connection terminals. Then, the battery current detection resistor R is externally connected to the first and second terminals T1 and T2. When the circuit elements are made available in chip form, the control microcomputer 60 for calculating the battery's residual capacity or charge capacity may be incorporated.

Second Embodiment

In contrast to the first embodiment comprising charge/discharge monitoring systems, one for the first terminal and the other for the second terminal, the present embodiment combines the charge/discharge monitoring systems into a single system except for the first and second terminal capacitors 30a and 30b. This makes it possible to resolve the impact of variations in circuit elements between a plurality of terminal-specific charge/discharge monitoring systems as compared with the first embodiment having the first and second terminal-specific charge/discharge monitoring systems. Therefore, it is possible to provide improved accuracy in the output of the terminal-by-terminal output change count difference output unit 50. This also allows for component count reduction, thus downsizing the circuit scale, which in turn ensures noise reduction, power and space savings and cost reduction.

Figure 2:
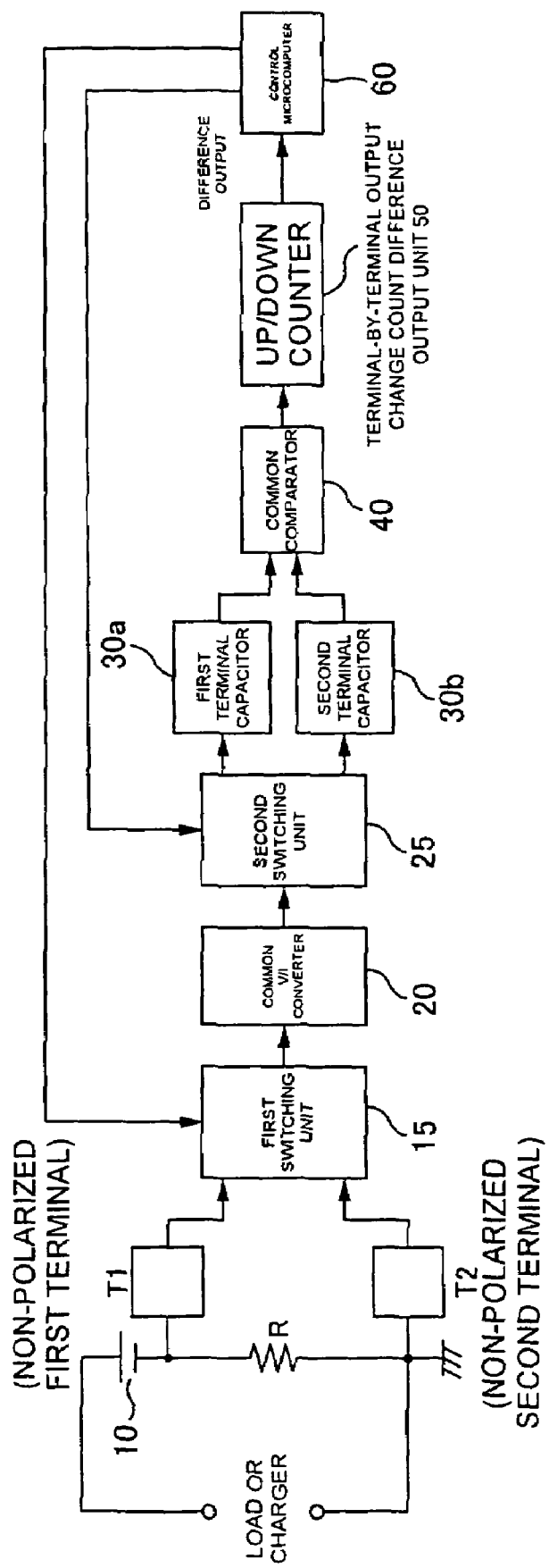
FIG. 2 is a block diagram showing the battery charge/discharge monitoring circuit according to a second embodiment of the present invention.

In detail, the current detection resistor R for detecting the battery 10's charge or discharge current is connected in series with the battery 10 as shown in FIG. 2. A load supplied with power by the battery 10 or a charger for charging the battery 10 is connected to the series circuit including the battery 10 and the current detection resistor R. The first terminal T1 is connected to one of the terminals (first terminal) of the current detection resistor R, whereas the second terminal T2 is connected to the other terminal (second terminal). The first and second terminals T1 and T2 are non-polarized, which means they are battery polarity insensitive. Also, either of the terminals (e.g., the second terminal T2) is grounded. Potential detection is separately conducted for the first and second terminals T1 and T2, namely, the terminals of the current detection resistor R.

That is, there is provided a terminal-specific charge/discharge monitoring system equipped with a series of a common voltage/current converter 20, the first and second terminal capacitors 30a and 30b and a common comparator 40, the terminal-by-terminal output change count difference output unit 50 and the control microcomputer respectively for the first and second terminals T1 and T2. The present embodiment is equipped with first and second switching units 15 and 25 for selecting terminal voltages appearing at the first and second terminals T1 and T2 connected to the current detection resistor R. The first and second switching units 15 and 25 perform switching operation in response to a command signal from the control microcomputer 60.

The output of the comparator 40 is fed to the terminal-by-terminal output change count difference output unit 50. The terminal-by-terminal output change count difference output unit 50 is comprised of a single counter referred to as so-called up/down counter (single difference output counter, common difference output counter). The up/down counter 50 counts the number of times the output of the comparator 40 changes. Having also the functionality of the subtracter 50c in the first embodiment, the up/down counter 50 outputs the difference between the numbers of times changes have occurred for the first and second terminals T1 and T2 obtained from the counting.

Such a configuration allows for a single terminal-specific charge/discharge monitoring system to operate as a single battery charge/discharge monitoring circuit, irrespective of whether the battery is charged or discharged.

A description will be given first of detection of the first terminal voltage. When the first and second switching units 15 and 25 select the first terminal, the voltage/current converter 20 converts the terminal voltage appearing at the first terminal T1 connected to the current detection resistor R to a current, supplying the current to the first terminal capacitor 30a. This results in the integrated voltage proportional to the charge or discharge current obtained from one end (e.g., positive terminal) of the battery 10 (voltage as an integrated value responsive to the charge accumulated in accordance with the current) being developed in the first terminal capacitor 30a.

The comparator 40 compares the integrated voltage developed by the first terminal capacitor 30a with the reference voltage. When the integrated voltage reaches the reference voltage, the comparator 40 varies its output. Then, the output of the comparator 40 varies again as a result of discharge of the first terminal capacitor 30a. Therefore, the up/down counter 50 counts the number of times the comparator 40's output changes, for example, by counting up.

A description will be given next of detection of the second terminal voltage. When the first and second switching units 15 and 25 switch connection by selecting the second terminal, the voltage/current converter 20 converts the terminal voltage appearing at the second terminal T2 connected to the current detection resistor R to a current, supplying the current to the second terminal capacitor 30b. This results in the integrated voltage proportional to the charge or discharge current obtained from one end (e.g., negative terminal) of the battery 10 being developed in the second terminal capacitor 30b.

The comparator 40 compares the integrated voltage developed by the first terminal capacitor 30b with the reference voltage. When the integrated voltage reaches the reference voltage, the comparator 40 varies its output. Then, the output of the comparator 40 varies again as a result of discharge of the first terminal capacitor 30b. Therefore, the up/down counter 50 counts the number of times the comparator 40's output changes, for example, by counting down.

For instance, if the first terminal T1 is connected to the positive terminal of the battery during discharge, the number of times changes take place counted by the up/down counter 50 not only reflects the battery's charge or discharge current but also includes error signal component such as ground level variation and common noise. On the other hand, the second terminal T2 is connected to the negative terminal of the battery during discharge. The number of times changes take place counted by the up/down counter 50 reflects error signal component alone such as ground level variation and common noise.

Therefore, the up/down counter 50 counts up for the first terminal while the counter counts down for the second terminal. As a result, the difference output of the up/down counter 50 has error signal component canceled out such as ground level variation and common noise, thus becoming a signal reflecting the battery's charge or discharge current alone. The difference output is supplied to the control microcomputer 60. The control microcomputer 60 determines the battery's charge or discharge current based on the obtained difference output and calculates the battery's residual capacity or charge capacity. The control microcomputer 60 notifies users and others of the battery's charge or discharge status or capacity through a display device, etc. based on the calculation result.

It is to be noted that, as an example of implementation of the battery charge/discharge monitoring circuit, at least the voltage/current converter 20, the first and second terminal capacitors 30*a* and 30*b*, the comparator 40 and the terminal-by-terminal output change count difference output unit (up/down counter) 50 are made into a chip (IC), with the first and second terminals T1 and T2 made available in the form of external connection terminals. Then, the battery current detection resistor R is externally connected to the first and second terminals T1 and T2. When the circuit elements are made available in chip form, the control microcomputer 60 for calculating the battery's residual capacity or charge capacity may be incorporated.

Specific Examples of Circuit Configuration and Operations Thereof

First Example Circuit Configuration

Figure 3:
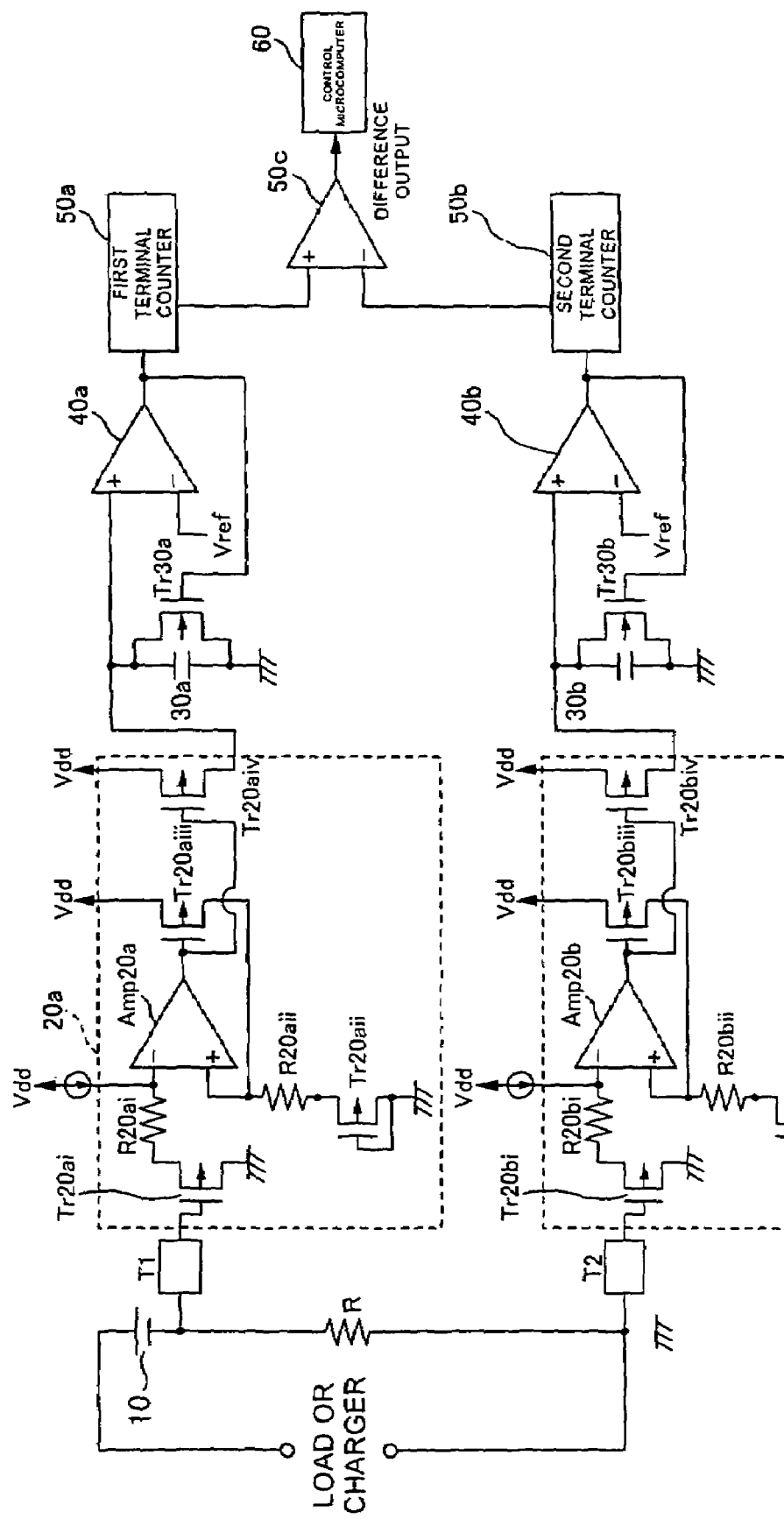
FIG. 3 is a circuit diagram showing a first example circuit configuration of the battery charge/discharge monitoring circuit according to the first embodiment of the present invention.

A specific circuit configuration example of the first embodiment shown in FIG. 1 is illustrated in FIG. 3. Since the matters discussed with reference to FIG. 1 are common, the description will focus on specific circuit configurations of the individual units.

First of all, a specific configuration example of the voltage/current converters 20*a* and 20*b* will be described. Since the voltage/current converters 20*a* and 20*b* are identical in configuration, a description will be made together as appropriate.

As shown in FIG. 3, gates of transistors (p-type channel MOSFETs) Tr20*ai* and Tr20*bi* are connected to the first and second terminals T1 and T2 to detect an extremely small potential change. The drains of the transistors Tr20*ai* and Tr20*bi* are grounded, whereas their sources are connected to the inverted input terminals of op-amps Amp20*a* and Amp20*b* via resistors R20*ai* and R20*bi*.

A series circuit including a resistor R20*aii* and a transistor (p-type channel MOSFET) Tr20*aii* is connected to the non-inverted input terminal of the op-amp Amp20*a*. Meanwhile, a series circuit including a resistor R20*bii* and a transistor (p-type channel MOSFET) Tr20*bii* is connected to the non-inverted input terminal of the op-amp Amp20*b*. The gates and drains of the transistors Tr20*aii* and Tr20*bii* are connected together and grounded.

It is to be noted that the resistors R20*ai* and R20*aii* have the same resistance value. The resistors R20*bi* and R20*bii* have the same resistance value.

The outputs of the op-amps Amp20*a* and Amp20*b* are fed to both gates of transistors (p-type channel MOSFETS) Tr20*aiii* and Tr20*aiv* and both gates of transistors (p-type channel MOSFETs) Tr20*biii* and Tr20*biv*. The drains of the transistors (p-type channel MOSFETs) Tr20*aiii* and Tr20*biii* are connected to the non-inverted input terminals of the op-amps Amp20*a* and Amp20*b*, thus forming a feedback path.

It is to be noted that the transistors Tr20*aiii* and Tr20*aiv* have the same input/output characteristic. Similarly, the transistors Tr20*biii* and Tr20*biv* have the same input/output characteristic.

Next, the operation of the voltage/current converters 20*a* and 20*b* will be described including that of the current detection resistor R. The current detection resistor R is an extremely small resistor on the order of several tens of milliohms and develops an extremely small voltage when a charge/discharge current flows therethrough. This potential developed between the terminals of the current detection resistor R is detected by the first and second terminals T1 and T2, applying the potential to the gates of the corresponding transistors Tr20*ai* and Tr20*bi*.

The sum of the drain-to-source voltage of the transistor Tr20*ai* and the terminal-to-terminal voltage of the resistor R20*ai* is applied to the inverted input terminal of the op-amp Amp20*a*. The sum of the drain-to-source voltage of the transistor Tr20*aii* and the terminal-to-terminal voltage of the resistor R20*aii* is applied to the non-inverted input terminal of the op-amp Amp20*a*. To eliminate the difference between the voltages applied to the inverted and non-inverted input terminals, the op-amp Amp20*a* outputs a voltage responsive to the difference. This allows a voltage responsive to the potential change of the first terminal T1 to be output from the op-amp Amp20*a*.

On the other hand, the sum of the drain-to-source voltage of the transistor Tr20*bi* and the terminal-to-terminal voltage of the resistor R20*bi* is applied to the inverted input terminal of the op-amp Amp20*b*. The sum of the drain-to-source voltage of the transistor Tr20*bii* and the terminal-to-terminal voltage of the resistor R20*bii* is applied to the non-inverted input terminal of the op-amp Amp20*b*. To eliminate the difference between the voltages applied to the inverted and non-inverted input terminals, the op-amp Amp20*b* outputs a voltage responsive to the difference. This allows a voltage responsive to the potential change of the second terminal T2 to be output from the op-amp Amp20*b*.

The output of the op-amp Amp20*a* is fed to the common gate of the transistors Tr20*aiii* and Tr20*aiv* having the same input/output characteristic. This makes it possible to flow the same current as the output current of the op-amp Amp20*a* to the first terminal capacitor 30*a* on the next stage.

Similarly, the output of the op-amp Amp20*b* is fed to the common gate of the transistors Tr20*biii* and Tr20*biv* having the same input/output characteristic. This makes it possible to flow the same current as the output current of the op-amp Amp20*b* to the second terminal capacitor 30*b* on the next stage.

As a result, the current proportional to the potential of the first terminal T1 is charged in the first terminal capacitor 30*a*. The current proportional to the potential of the second terminal T2 is also charged in the second terminal capacitor 30*b*. Then, the terminal-to-terminal voltage of the first terminal capacitor 30*a* is compared with a reference voltage Vref by the comparator 40*a* (comparison unit). The terminal-to-terminal voltage of the second terminal capacitor 30*b* is compared with the reference voltage Vref by the comparator 40*b* (comparison unit).

Transistors (n-type channel MOSFETs) Tr30*a* and Tr30*b* are connected in parallel to the first and second terminal capacitors 30*a* and 30*b* to reset and discharge the individual capacitors.

When the individual terminal-to-terminal voltages of the first and second terminal capacitors 30*a* and 30*b* reach the reference voltage Vref, the outputs of the comparators 40*a* and 40*b* are inverted from L level to H level. The outputs of the comparators 40*a* and 40*b* are fed to the gates of the transistors Tr30*a* and Tr30*b* as reset signals. This in turn inverts the outputs of the comparators 40*a* and 40*b* from H level to L level. Therefore, the comparators 40*a* and 40*b* output pulse signals making a transition from L level to H level and then to L level. These pulse signals are counted by the first and second terminal counters 50a and 50b, feeding the results to the input terminals of the subtracter 50c including a comparator. It is to be noted that the reset signals fed to the gates of the transistors Tr30a and Tr30b may be sent out from the control microcomputer 60.

The comparator 50c outputs the difference between the counted result of the first terminal counter 50a and that of the second terminal counter 50b to the control microcomputer 60. It is to be noted that, as for transistors used in the present embodiment, whether to use n-type or p-type as the polarity of the transistors is a design matter and that either polarity may be employed.

Second Example Circuit Configuration

Figure 4:
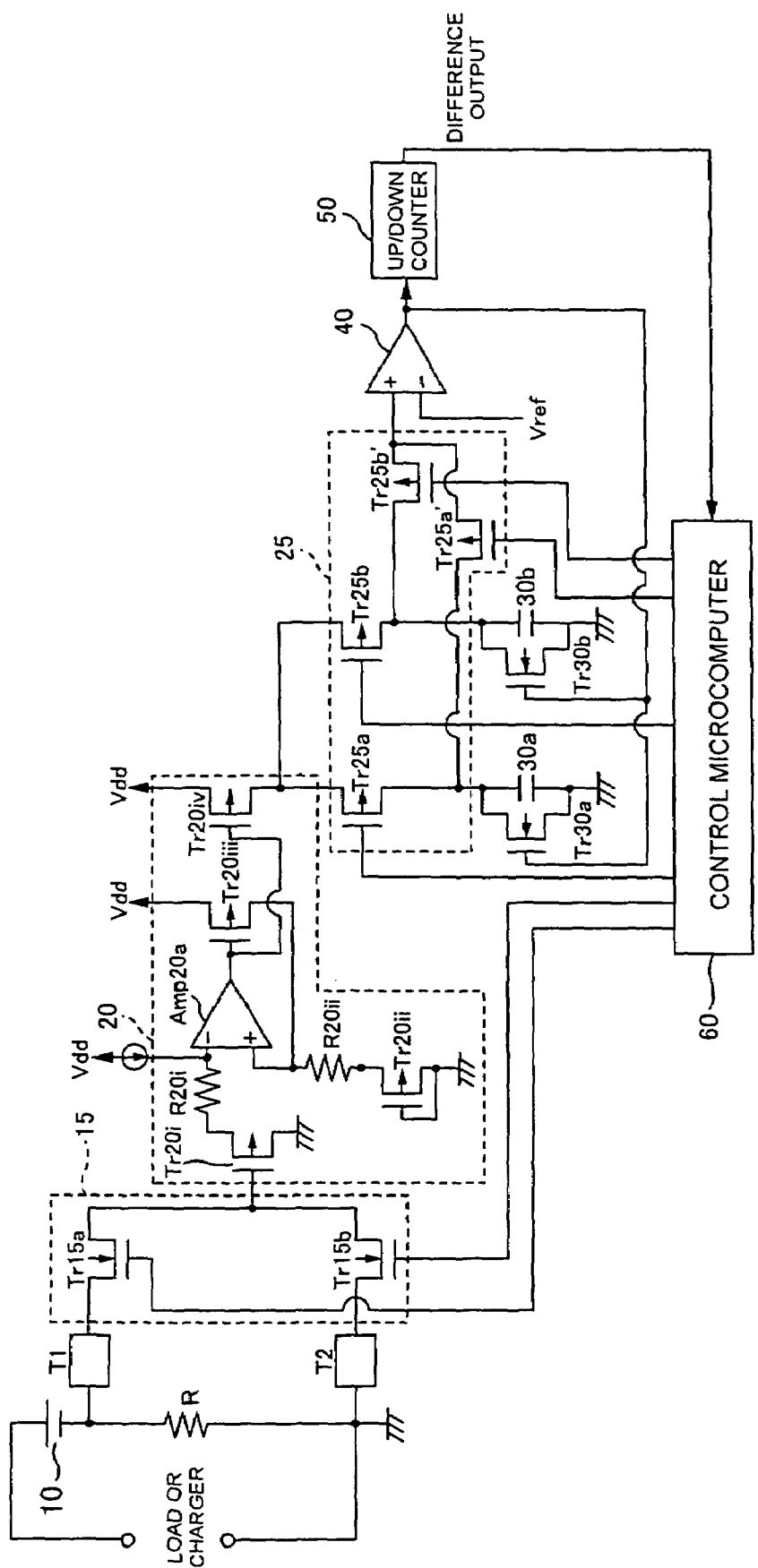
FIG. 4 is a circuit diagram showing a second example circuit configuration of the battery charge/discharge monitoring circuit according to the second embodiment of the present invention.

A specific circuit configuration example of the second embodiment shown in FIG. 2 is illustrated in FIG. 4. Since the matters discussed with reference to FIG. 2 are common, the description will focus on differences from the first embodiment of FIG. 3 in the specific circuit configurations of the individual units.

First, the first switching unit 15 will be described. The first switching unit 15 is provided with the drain-source path of a first terminal selection transistor (n-type channel MOSFET) Tr15a and the drain-source path of a second terminal selection transistor (n-type channel MOSFET) Tr15b. The drain-source path of the first terminal selection transistor Tr15a is connected between the first terminal T1 and the gate of a transistor (p-type channel MOSFET) Tr20i of the voltage/current converter 20. The drain-source path of the second terminal selection transistor Tr15b is connected between the second terminal T2 and the gate of the transistor Tr20i of the voltage/current converter 20. On/off signal from the control microcomputer 60 is fed to the gates of the first and second terminal selection transistors Tr15a and Tr15b.

The voltage/current converter 20 is identical in configuration to the voltage/current converters 20a and 20b of FIG. 3.

The transistors (n-type channel MOSFETs) Tr30a and Tr30b are connected in parallel to the first and second terminal capacitors 30a and 30b to reset and discharge the individual capacitors.

The second switching unit 25 will be described. As shown in FIG. 4, the second switching unit 25 is provided with first terminal selection transistors (p-type channel MOSFETs) Tr25a and Tr25a' and second terminal selection transistors (p-type channel MOSFETS) Tr25b and Tr25b'. The drain-source path of the first terminal selection transistor 25a is connected in series between the drain of a transistor Tr20iv and the non-grounded side of the terminal capacitor 30a. The drain-source path of the first terminal selection transistor 25a' is connected in series between the non-grounded side of the terminal capacitor 30a and the non-inverted input terminal of the comparator of which the comparator 40 is comprised. The drain-source path of the second terminal selection transistor 25b is connected in series between the drain of a transistor Tr20iv and the non-grounded side of the terminal capacitor 30b. The drain-source path of the second terminal selection transistor 25b' is connected in series between the non-grounded side of the terminal capacitor 30b and the non-inverted input terminal of the comparator of which the comparator 40 is comprised. Switching command on/off signal from the control microcomputer 60 is fed to the individual gates of the first and second terminal selection transistors Tr15a, Tr15b, Tr25a, Tr25a', Tr25b and Tr25b'. The control microcomputer 60 quickly turns this on/off signal on/off, alternately detecting the potential of the first and second terminals T1 and T2 at high speed.

Next, the operation of the voltage/current converters 20a and 20b will be described including that of the current detection resistor R. The current detection resistor R is an extremely small resistor on the order of several tens of milliohms and develops an extremely small voltage when a charge/discharge current flows therethrough.

First, a description will be given of the case in which detection of the potential developed in the first terminal T1 is selected by the switching command signal from the control microcomputer. The switching command signal from the control microcomputer turns on the first terminal selection transistors Tr15a, Tr25a and Tr25a' and turns off the second terminal selection transistors Tr15b, Tr25b and Tr25b'.

The sum of the drain-to-source voltage of the transistor Tr20i and the terminal-to-terminal voltage of a resistor R20i is applied to the inverted input terminal of an op-amp Amp20. Similarly, the sum of the drain-to-source voltage of a transistor Tr20ii and the terminal-to-terminal voltage of a resistor R20ii is applied to the non-inverted input terminal of the op-amp Amp20. To eliminate the difference between the voltages applied to the inverted and non-inverted input terminals, the op-amp Amp20 outputs a voltage responsive to the difference. This allows a voltage responsive to the potential change of the first terminal T1 to be output from the op-amp Amp20.

The output of the op-amp Amp20 is fed to the common gate of a transistor Tr20iii and the transistor Tr20iv having the same input/output characteristic. This makes it possible to flow the same current as the output current of the op-amp Amp20 to the first terminal capacitor 30a on the next stage via the transistor Tr25a.

As a result, the current proportional to the potential of the first terminal T1 is charged in the first terminal capacitor 30a. Then, the terminal-to-terminal voltage of the first terminal capacitor 30a is fed to the non-inverted input terminal of the comparator 40 (comparison unit) via the transistor Tr25a' for comparison with the reference voltage Vref.

The transistor (n-type channel MOSFET) Tr30a is connected in parallel to the first terminal capacitor 30a to reset and discharge the capacitor.

When the terminal-to-terminal voltage of the first terminal capacitor 30a reaches the reference voltage Vref, the output of the comparator 40 is inverted from L level to H level. The output of the comparator 40 is fed to the gate of the transistor Tr30a as a reset signal. This in turn inverts the output of the comparator 40 from H level to L level. Therefore, the comparator 40 outputs a pulse signal making a transition from L level to H level and then to L level. This pulse signal is counted by the up/down counter 50.

Next, a description will be given of the case in which detection of the potential developed in the second terminal T2 is selected by the switching command signal from the control microcomputer 60. The switching command signal from the control microcomputer 60 turns off the first terminal selection transistors Tr15a, Tr25a and Tr25a' and turns on the second terminal selection transistors Tr15b, Tr25b and Tr25b'.

The voltage/current converter 20 operates in the same manner as when an extremely small potential change in the first terminal T1 is detected. A voltage responsive to the potential change of the second terminal T2 is output from the op-amp Amp20.

As a result, the current proportional to the potential of the second terminal T2 is charged in the second terminal capacitor 30b. Then, the terminal-to-terminal voltage of the second terminal capacitor 30b is fed to the non-inverted input terminal of the comparator 40 via the transistor Tr25b' for comparison with the reference voltage Vref.

The transistor (n-type channel MOSFET) Tr30b is connected in parallel to the second terminal capacitor 30b to reset and discharge the capacitor.

When the terminal-to-terminal voltage of the second terminal capacitor 30b reaches the reference voltage Vref, the output of the comparator 40 is inverted from L level to H level. The output of the comparator 40 is fed to the gate of the transistor Tr30b as a reset signal. This in turn inverts the output of the comparator 40 from H level to L level. Therefore, the comparator 40 outputs a pulse signal making a transition from L level to H level and then to L level. This pulse signal is counted by the up/down counter 50. It is to be noted that the reset signals fed to the gate of the transistor Tr30b may be sent out from the control microcomputer 60.

The up/down counter 50 outputs the difference between the counted result corresponding to the potential developed in the first terminal T1 and the counted result corresponding to the potential developed in the second terminal T2 to the control microcomputer 60. It is to be noted that, as for transistors used in the present embodiment, whether to use n-type or p-type as the polarity of the transistors is a design matter and that either polarity may be employed.

Third Example Circuit Configuration

Figure 5:
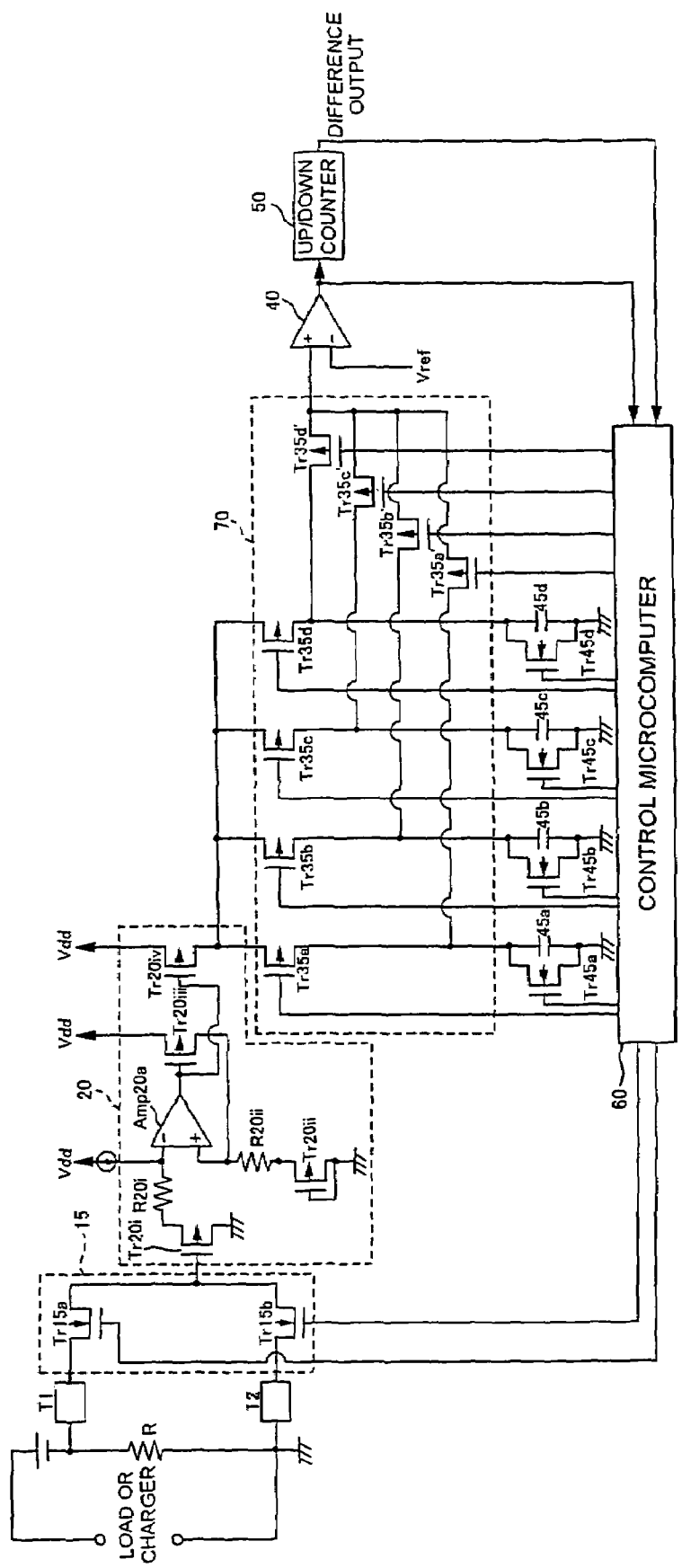
FIG. 5 is a circuit diagram showing a third example circuit configuration of the battery charge/discharge monitoring circuit according to the second embodiment of the present invention.

A description will be given of another specific example of the second embodiment in FIG. 2 with reference to FIG. 5. FIG. 5 is a circuit diagram showing another specific configuration example according to the second embodiment of the present invention. It is to be noted that the same symbols as those in FIG. 4 are assigned to the same elements in FIG. 5, with their description omitted.

Grounded at one end, capacitors 45a, 45b, 45c and 45d are supplied with the drain current of the transistor Tr20iv, thus developing an integrated voltage. It is to be noted that any combination of two of the capacitors 45a, 45b, 45c and 45d is selected as appropriate, becoming the first and second terminal capacitors. Having their drain-source paths connected respectively in parallel to both ends of the capacitors 45a, 45b, 45c and 45d, transistors (n-channel MOSFETs) Tr45a, Tr45b, Tr45c and Tr45d are designed to discharge the integrated voltages of the capacitors 45a, 45b, 45c and 45d. It is to be noted that the capacitors 45a, 45b, 45c and 45d are initially in the state where discharge is complete.

A second switching unit 70 has transistors (p-channel MOSFETs) Tr35a, Tr35b, Tr35c and Tr35d and transistors (p-channel MOSFETs) Tr35a', Tr35b', Tr35c' and Tr35d'. Having their drain-source paths connected between the drain of the transistor Tr20iv and the non-grounded sides of the capacitors 45a, 45b, 45c and 45d, the transistors Tr35a, Tr35b, Tr35c and Tr35d are designed to select the capacitors 45a, 45b, 45c and 45d to be charged in order to develop an integrated voltage. Having their drain-source paths connected between the drains of the transistors Tr35a, Tr35b, Tr35c and Tr35d and the non-inverted input terminal of the comparator 40, the transistors Tr35a', Tr35b', Tr35c' and Tr35d' turn on or off at the same timings as with the transistors Tr35a, Tr35b, Tr35c and Tr35d. This allows the integrated voltages developed in the capacitors 45a, 45b, 45c and 45d to be selectively applied to the non-inverted input terminal of the comparator 40.

The control microcomputer 60 outputs signals to turn on/off the transistors Tr15a and Tr15b, the transistors Tr35a, Tr35b, Tr35c and Tr35d, the transistors Tr35a', Tr35b', Tr35c' and Tr35d' and the Tr45a, Tr45b, Tr45c and Tr45d at high speed.

When the transistor Tr15a turns on, the voltage/current converter 20 converts the potential of the first terminal T1 to a current. On the other hand, when the transistor Tr15b turns on, the voltage/current converter 20 converts the potential of the second terminal T2 to a current. When the transistors Tr35a and Tr35a' turn on, the transistor Tr45a is off, supplying the capacitor 45a with the current of the voltage/current converter 20 corresponding to the potential of the first terminal T1 or the second terminal T2 and developing an integrated voltage therein. When the transistors Tr35b and Tr35b' turn on, the transistor Tr45b is off, supplying the capacitor 45b with the current of the voltage/current converter 20 corresponding to the potential of the first terminal T1 or the second terminal T2 and developing an integrated voltage therein. When the transistors Tr35c and Tr35c' turn on, the transistor Tr45c is off, supplying the capacitor 45c with the current of the voltage/current converter 20 corresponding to the potential of the first terminal T1 or the second terminal T2 and developing an integrated voltage therein. Further, when the transistors Tr35d and Tr35d' turn on, the transistor Tr45d is off, supplying the capacitor 45d with the current of the voltage/current converter 20 corresponding to the potential of the first terminal T1 or the second terminal T2 and developing an integrated voltage therein. It is to be noted that the transistors Tr45a, Tr45b, Tr45c and Tr45d turn on when the capacitors 45a, 45b, 45c and 45d are not used as the capacitors holding the integrated voltages, thus discharging the integrated voltages.

In the third example circuit configuration shown in FIG. 5, the first and second terminal capacitors are assigned to a combination of two of the capacitors 45a, 45b, 45c and 45d.

For instance, if the first terminal capacitor is assigned to the capacitors 45a and 45b, the control microcomputer 60 turns on the transistors Tr35a and Tr35a', turns off the transistors Tr35b and Tr35b' and further turns on the transistor Tr45b, with the transistor Tr15a turned on. This allows the capacitor 45a to develop an integrated voltage corresponding to the potential of the first terminal T1, resulting in the integrated voltage being applied to the non-inverted input terminal of the comparator 40. When the integrated voltage developed by the capacitor 45a reaches the reference voltage Vref, the comparator 40 supplies a high-level output to the up/down counter 50 and the control microcomputer 60. Next, the control microcomputer 60 turns off the transistor Tr45b, turns off the transistors Tr35a and Tr35a', turns on the transistors Tr35b and Tr35b' and further turns on the transistor Tr45a, with the transistor Tr15a turned on. This allows the capacitor 45b to develop an integrated voltage corresponding to the potential of the first terminal T1, resulting in the integrated voltage being applied to the non-inverted input terminal of the comparator 40. On the other hand, the capacitor 45a completes its discharge. When the integrated voltage developed by the capacitor 45b reaches the reference voltage Vref, the comparator 40 supplies a high-level output to the up/down counter 50 and the control microcomputer 60. Hereafter, the same operation as described above is repeated. That is, the capacitors 45a and 45b operate as complementary elements—elements that operate such that when one of them develops an integrated voltage, the other completes its discharge. This reduces the dead time in discharge of the capacitors 45a and 45b when the potential of the first terminal T1 is detected, thus providing improved accuracy in battery capacity or residual capacity measurement.

Additionally, for instance, if the second terminal capacitor is assigned to the capacitors 45c and 45d, the control microcomputer 60 turns on the transistors Tr35c and Tr35c', turns off the transistors Tr35d and Tr35d' and further turns on the transistor Tr45d, with the transistor Tr15b turned on. This allows the capacitor 45c to develop an integrated voltage corresponding to the potential of the second terminal T2, resulting in the integrated voltage being applied to the non-inverted input terminal of the comparator 40. When the integrated voltage developed by the capacitor 45c reaches the reference voltage Vref, the comparator 40 supplies a high-level output to the up/down counter 50 and the control microcomputer 60. Next, the control microcomputer 60 turns off the transistor Tr45d, turns off the transistors Tr35c and Tr35c', turns on the transistors Tr35d and Tr35d' and further turns on the transistor Tr45c, with the transistor Tr15b turned on. This allows the capacitor 45d to develop an integrated voltage corresponding to the potential of the second terminal T2, resulting in the integrated voltage being applied to the non-inverted input terminal of the comparator 40. On the other hand, the capacitor 45c completes its discharge. When the integrated voltage developed by the capacitor 45d reaches the reference voltage Vref, the comparator 40 supplies a high-level output to the up/down counter 50 and the control microcomputer 60. Hereafter, the same operation as described above is repeated. That is, the capacitors 45c and 45d operate as complementary elements—elements that operate such that when one of them develops an integrated voltage, the other completes its discharge. This reduces the dead time in discharge of the capacitors 45c and 45d when the potential of the second terminal T2 is detected, thus providing improved accuracy in battery capacity or residual capacity measurement.

Alternatively, the first and second terminal capacitors may be selectively assigned to a combination of two of the capacitors 45a, 45b, 45c and 45d in response to on/off signal from the control microcomputer 60. That is, the first and second terminal capacitors may be assigned to a combination of the capacitors (45a, 45b), (45a, 45c), (45a, 45d), (45b, 45c), (45b, 45d) or (45c, 45d) as appropriate. This keeps the combination as the first and second terminal capacitors unfixed, thus reducing capacitance error of the capacitors 45a, 45b, 45c and 45d as a result of averaging and providing improved accuracy in battery capacity or residual capacity measurement. Further alternatively, the first and second terminal capacitors may be selectively assigned to a combination of two of three capacitors. This allows downsizing of the battery charge/discharge monitoring circuit. It is possible, if the battery charge/discharge monitoring circuit is integrated into an IC in particular, to downsize the charger and others incorporating the IC.

OTHER EMBODIMENTS

While the battery charge/discharge monitoring circuit and method according to the present invention have been described, the above description is intended to facilitate the understanding of the present invention and not restrictive. The present invention may be changed or modified without departing from the concept thereof and certainly includes equivalents of the invention.

In FIGS. 1 and 3, a plurality of capacitors may be used as the first and second terminal capacitors.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

It is claimed:

1. A circuit for monitoring charge/discharge of a battery, comprising:
   a first terminal connected to one end of a single current detection resistor serially connected to the battery so as to detect a charge current or a discharge current of the battery;
   a second terminal connected to the other end of the current detection resistor;
   a converter that converts a terminal potential of the first terminal at which a potential of the one end of the current detection resistor appears and a terminal potential of the second terminal at which a potential of the other end of the current detection resistor appears, into currents respectively;
   a first terminal capacitor that develops an integrated voltage with supply of the current as converted by the converter from the terminal potential of the first terminal;
   a second terminal capacitor that develops an integrated voltage with supply of the current as converted by the converter from the terminal potential of the second terminal;
   a comparator that compares the integrated voltages developed by the first and second terminal capacitors with a reference voltage; and
   an output section that outputs a difference between
      the number of times of change in an output of the comparator, the output changing when the integrated voltage of the first terminal capacitor reaches the reference voltage, and
      the number of times of change in an output of the comparator, the output changing when the integrated voltage of the second terminal capacitor reaches the reference voltage.

2. The circuit for monitoring charge/discharge of a battery according to claim 1, wherein
   the first terminal capacitor is the one selected from two or more capacitors, and wherein
   when one capacitor of the two or more capacitors has developed an integrated voltage corresponding to the terminal potential of the first terminal which has reached the reference voltage, at least one capacitor already discharged of the two or more capacitors other than the one capacitor starts to develop an integrated voltage corresponding to the terminal potential of the first terminal, and wherein
   when the at least one capacitor of the two or more capacitors other than the one capacitor has developed an integrated voltage corresponding to the terminal potential of the first terminal which has reached the reference voltage, one capacitor already discharged of the two or more capacitors starts to develop an integrated voltage corresponding to the terminal potential of the first terminal.

3. The circuit for monitoring charge/discharge of a battery according to claim 2, wherein
   the one capacitor is discharged when the at least one capacitor of the two or more capacitors other than the one capacitor has developed the integrated voltage corresponding to the terminal potential of the first terminal which has reached the reference voltage, and wherein the at least one capacitor of the two or more capacitors other than the one capacitor is discharged when the one capacitor has developed the integrated voltage corresponding to the terminal potential of the first terminal which has reached the reference voltage.

4. The circuit for monitoring charge/discharge of a battery according to claim 1, wherein the second terminal capacitor is the one selected from two or more capacitors, and wherein when one capacitor of the two or more capacitors has developed an integrated voltage corresponding to the terminal potential of the second terminal which has reached the reference voltage, at least one capacitor already discharged of the two or more capacitors other than the one capacitor starts to develop an integrated voltage corresponding to the terminal potential of the second terminal, and wherein when the at least one capacitor of the two or more capacitors other than the one capacitor has developed an integrated voltage corresponding to the terminal potential of the second terminal which has reached the reference voltage, one capacitor already discharged of the two or more capacitors starts to develop an integrated voltage corresponding to the terminal potential of the second terminal.

5. The circuit for monitoring charge/discharge of a battery according to claim 4, wherein the one capacitor is discharged when the at least one capacitor of the two or more capacitors other than the one capacitor has developed the integrated voltage corresponding to the terminal potential of the second terminal which has reached the reference voltage, and wherein the at least one capacitor of the two or more capacitors other than the one capacitor is discharged when the one capacitor has developed the integrated voltage corresponding to the terminal potential of the second terminal which has reached the reference voltage.

6. The circuit for monitoring charge/discharge of a battery according to claim 1, wherein the comparator includes a shared single comparator section that compares the integrated voltage of the first terminal capacitor and the integrated voltage of the second terminal capacitor with the reference voltage respectively.

7. The circuit for monitoring charge/discharge of a battery according to claim 6, wherein the output section includes an up/down counter that
upcounts/downcounts the number of times of change in the output of the comparator section having an output that changes every time the integrated voltage of the first terminal capacitor reaches the reference voltage, and that
downcounts/upcounts the number of times of change in the output of the comparator section having an output that changes every time the integrated voltage of the second terminal capacitor reaches the reference voltage.

8. The circuit for monitoring charge/discharge of a battery according to claim 1, wherein the converter includes a shared single converter section that selectively converts either one of the terminal potential of the first terminal or the terminal potential of the second terminal, into a current, and wherein the circuit further comprises a switching section that
connects the first terminal to an input of the converter section and connects the output of the converter section to the first terminal capacitor, or that
connects the second terminal to an input of the converter section and connects the output of the converter section to the second terminal capacitor.

9. The circuit for monitoring charge/discharge of a battery according to claim 1, wherein the circuit is integrated into an integrated circuit.

10. A method of monitoring charge/discharge of a battery, comprising the steps of:

converting a terminal potential of the first terminal at which a potential of one end of a single current detection resistor serially connected to the battery appears and a terminal potential of the second terminal at which a potential of the other end of the current detection resistor appears, into a current respectively so as to detect a charge current or discharge current of the battery;

developing an integrated voltage with supply of the current as converted from the terminal potential of the first terminal;

developing an integrated voltage with supply of the current as converted from the terminal potential of the second terminal;

comparing the integrated voltage corresponding to the terminal potential of the first terminal and the integrated voltage corresponding to the terminal potential of the second terminal with a reference voltage respectively; and outputting a difference between
the number of times that the integrated voltage corresponding to the terminal potential of the first terminal reaches the reference voltage, and
the number of times that the integrated voltage corresponding to the terminal potential of the second terminal reaches the reference voltage.

11. A circuit for monitoring charge/discharge of a battery, comprising:

a first terminal connected to one end of a current detection resistor serially connected to the battery so as to detect a charge current or a discharge current of the battery;

a second terminal connected to the other end of the current detection resistor;

a converter shared between the first and second terminals, that converts a terminal potential of the first terminal at which a potential of the one end of the current detection resistor appears and a terminal potential of the second terminal at which a potential of the other end of the current detection resistor appears, into currents respectively;

a first terminal capacitor that develops an integrated voltage with supply of the current as converted by the converter from the terminal potential of the first terminal;

a second terminal capacitor that develops an integrated voltage with supply of the current as converted by the converter from the terminal potential of the second terminal;

a switching section that connects the first terminal to an input of the converter and connects the output of the converter to the first terminal capacitor, or that connects the second terminal to an input of the converter and connects the output of the converter to the second terminal capacitor;

a comparator that compares the integrated voltages developed by the first and second terminal capacitors with a reference voltage; and an output section that outputs a difference between the number of times of change in an output of the comparator, the output changing when the integrated voltage of the first terminal capacitor reaches the reference voltage, and the number of times of change in an output of the comparator, the output changing when the integrated voltage of the second terminal capacitor reaches the reference voltage.

12. A circuit for monitoring charge/discharge of a battery, comprising:

a first terminal connected to one end of a single current detection resistor serially connected to the battery so as to detect a charge current or a discharge current of the battery;

a second terminal connected to the other end of the current detection resistor;

a converter that converts a terminal potential of the first terminal at which a potential of the one end of the current detection resistor appears and a terminal potential of the second terminal at which a potential of the other end of the current detection resistor appears, into currents respectively;

a first terminal capacitor that develops an integrated voltage with supply of the current as converted by the converter from the terminal potential of the first terminal;

a second terminal capacitor that develops an integrated voltage with supply of the current as converted by the converter from the terminal potential of the second terminal;

a comparator that compares the integrated voltages developed by the first and second terminal capacitors with a reference voltage; and an output section that outputs a difference between the number of times of change in an output of the comparator, the output changing when the integrated voltage of the first terminal capacitor reaches the reference voltage, and the number of times of change in an output of the comparator, the output changing when the integrated voltage of the second terminal capacitor reaches the reference voltage, wherein the first terminal capacitor is comprised of a plurality of capacitors such that when one capacitor of the plurality of capacitors has developed the integrated voltage corresponding to the first terminal which has reached the reference voltage, at least one capacitor of the plurality of capacitors other than the one capacitor starts to develop the integrated voltage corresponding to the first terminal, and wherein the second terminal capacitor is comprised of a plurality of capacitors such that when one capacitor of the plurality of capacitors has developed the integrated voltage corresponding to the second terminal which has reached the reference voltage, at least one capacitor of the plurality of capacitors other than the one capacitor starts to develop the integrated voltage corresponding to the second terminal.

13. A circuit for monitoring charge/discharge of a battery, comprising:

a first terminal connected to one end of a single current detection resistor serially connected to the battery so as to detect a charge current or a discharge current of the battery;

a second terminal connected to the other end of the current detection resistor;

a converter that converts a terminal potential of the first terminal at which a potential of the one end of the current detection resistor appears and a terminal potential of the second terminal at which a potential of the other end of the current detection resistor appears, into currents respectively;

a first terminal capacitor that develops an integrated voltage with supply of the current as converted by the converter from the terminal potential of the first terminal;

a second terminal capacitor that develops an integrated voltage with supply of the current as converted by the converter from the terminal potential of the second terminal;

a comparator that compares the integrated voltages developed by the first and second terminal capacitors with a reference voltage; and an output section that outputs a difference between the number of times of change in an output of the comparator, the output changing when the integrated voltage of the first terminal capacitor reaches the reference voltage, and the number of times of change in an output of the comparator, the output changing when the integrated voltage of the second terminal capacitor reaches the reference voltage, wherein the circuit is integrated into an integrated circuit.

* * * * *